(12) United States Patent
Feng et al.

(10) Patent No.: US 10,854,676 B2
(45) Date of Patent: Dec. 1, 2020

(54) SEMICONDUCTOR DEVICE HAVING CAPPED AIR CAPS BETWEEN BURIED BIT LINES AND BURIED GATE

(71) Applicants: UNITED MICROELECTRONICS CORP., Hsin-Chu (TW); Fujian Jinhua Integrated Circuit Co., Ltd., Quanzhou (CN)

(72) Inventors: Li-Wei Feng, Kaohsiung (TW); Ying-Chiao Wang, Zhanghua County (TW); Tzu-Tsen Liu, Kaohsiung (TW); Tsung-Ying Tsai, Kaohsiung (TW); Chien-Ting Ho, Taichung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 15/873,909

(22) Filed: Jan. 18, 2018

(65) Prior Publication Data

US 2018/0211964 A1  Jul. 26, 2018

(30) Foreign Application Priority Data

Jan. 24, 2017  (CN) .......................... 2017 1 0059512

(51) Int. Cl.
*H01L 27/24* (2006.01)
*H01L 27/108* (2006.01)
*H01L 21/02* (2006.01)
*H01L 21/764* (2006.01)

(52) U.S. Cl.
CPC ........ *H01L 27/249* (2013.01); *H01L 21/0217* (2013.01); *H01L 21/02164* (2013.01); *H01L 21/764* (2013.01); *H01L 27/10847* (2013.01); *H01L 27/10885* (2013.01)

(58) Field of Classification Search
CPC ........................ H01L 27/10885; H01L 27/249
See application file for complete search history.

(56) References Cited

U.S. PATENT DOCUMENTS

| 9,391,138 | B2 | 7/2016 | Kim et al. | |
| 9,431,324 | B2 | 8/2016 | Shin | |
| 2016/0225710 | A1 | 8/2016 | Hwang | |
| 2017/0005099 | A1* | 1/2017 | Lee | H01L 21/82348 |
| 2017/0323893 | A1* | 11/2017 | Kim | H01L 27/10885 |
| 2018/0342521 | A1* | 11/2018 | Son | H01L 21/31111 |
| 2019/0067294 | A1* | 2/2019 | Lee | H01L 27/10888 |

* cited by examiner

*Primary Examiner* — Michael Jung
(74) *Attorney, Agent, or Firm* — Winston Hsu

(57) ABSTRACT

A semiconductor device and method of forming the same, the semiconductor device includes plural bit lines, plural conductive patterns, plural conductive pads and a spacer. The bit lines are disposed on a substrate, along a first direction. The conductive patterns are disposed on the substrate, along the first direction, wherein the conductive patterns and the bit lines are alternately arranged in a second direction perpendicular to the first direction. The conductive pads are arranged in an array and disposed over the conductive patterns and the bit lines. The spacer is disposed between the bit lines and the conductive patterns, under the conductive pads, wherein the spacers includes a tri-layered structure having a first layer, a second layer and a third layer, and the second layer includes a plurality of air gaps separated arranged along the first direction.

9 Claims, 7 Drawing Sheets

SEMICONDUCTOR DEVICE HAVING CAPPED AIR CAPS BETWEEN BURIED BIT LINES AND BURIED GATE

BACKGROUND OF THE INVENTION

1. Field of the Invention

The present invention generally relates to the field of semiconductor memory devices and forming method thereof, and more particularly to a dynamic random access memory (DRAM) device and a forming method thereof.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. For example, the reduced line-width also increases the line resistance (R). Furthermore, the shrunk spaces between wires also increase the parasitic capacitance (C), so that, the RC delay is therefore increase to achieve poor efficiency. Therefore, there is still a need to provide an improved memory cell with a buried gate to gain enhanced performance and reliability of the corresponding memory device.

SUMMARY OF THE INVENTION

One object of the present invention is to provide a method of forming a semiconductor memory device, in which, an air-gap layer is formed between bit lines and storage node contacts (SNCs) while forming the SNCs and the storage node pads (SN pads). That is, the low resistant air-gap layer is able to improve the aforementioned RC delay issues under a simplified process flow.

One object of the present invention is to provide a semiconductor memory device, in which, an air-gap layer is disposed between bit lines and SNCs, so as to improve the RC delay issues. Also, the semiconductor memory device may further improve the possible collapse issues caused by the poor supporting of the air-gap layer.

To achieve the purpose described above, the present invention provides a method of forming a semiconductor memory device, including the following steps. First of all, a plurality of bit lines is formed extended along a first direction, and a tri-layered spacer disposed at two sides of each of the bit lines. Then, a plurality of conductive patterns is formed, and the conductive patterns and the bit lines are alternately arranged along a second direction which is perpendicular to the first direction. Next, a metal layer is formed to cover the bit lines and the conductive patterns. Following these, a portion of the metal layer is removed to form a plurality of openings in the metal layer, and the openings are extended along the second direction to cross the bit lines and the conductive patterns, wherein a portion of the bit lines and the tri-layered spacers disposed at two sides thereof are exposed from the openings. Then, a second layer of each of the tri-layered spacers exposed from the openings is removed, to form an air-gap layer in each of the tri-layered spacers. Finally, another portion of the metal layer is removed to form a plurality of conductive pads, after forming the air-gap layers.

To achieve the purpose described above, the present invention provides a semiconductor memory device, including a plurality of bit lines, a plurality of conductive patterns, a plurality of conductive pads, and a tri-layered spacer. The bit lines are extended along a first direction. The conductive patterns are extended along the first direction, wherein the bit lines and the conductive patterns are alternately arranged along a second direction which is perpendicular to the first direction. The conductive pads are disposed in an array arrangement, on the conductive patterns and the bit lines. The tri-layered spacer is disposed between the bit lines and the conductive patterns, below the conductive pads, wherein the tri-layered spacer includes a first layer, a second layer and a third layer, and the second layer includes a plurality of air-gap layers separated disposed along the first direction.

In overall speaking, the forming method of the present invention is mainly performed by forming an air-gap layer between the bit lines and the storage nodes during the forming processes of the storage nodes, with the multilayer spacer being partially etched under the coverage of the patterned metal layer formed in the previously first etching step. That is, only a part of the second layer of the multilayer spacer is removed to form the air-gap layer, and the rest part of the second layer of the multilayer spacer is remained, so as to make the air-gap layer to include plural separate fragments. The separate fragments of the air-gap layer are namely separated by the remained second layer, so that, the air-gap layer of the present invention may both achieve the lower dielectric constant and better supporting. Thus, the method of the present invention can improve the RC delay issue and the possible collapse at the same time.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 11 are schematic diagrams illustrating a method of forming a semiconductor memory device according to a first preferred embodiment of the present invention, in which:

FIG. 1 shows a semiconductor memory device at the beginning of the forming process;

FIG. 2 shows a top view of a semiconductor memory device after forming a mask layer;

FIG. 3 shows a cross-sectional view taken along a cross line A-A' in FIG. 2;

FIG. 4 shows a top view of a semiconductor memory device after performing an etching process;

FIG. 5 shows a cross-sectional view taken along a cross line A-A' in FIG. 4;

FIG. 6 shows a cross-sectional view of a semiconductor memory device after forming an air-gap layer;

FIG. 7 shows a top view of a semiconductor memory device after forming another mask layer;

FIG. 8 shows a cross-sectional view taken along a cross line A-A' in FIG. 7;

FIG. 9 shows a top view of a semiconductor memory device after performing another etching process;

FIG. 10 shows a cross-sectional view taken along a cross line A-A' in FIG. 9;

FIG. 11 shows a cross-sectional view taken along a cross line B-B' in FIG. 9.

DETAILED DESCRIPTION

Figure 1:
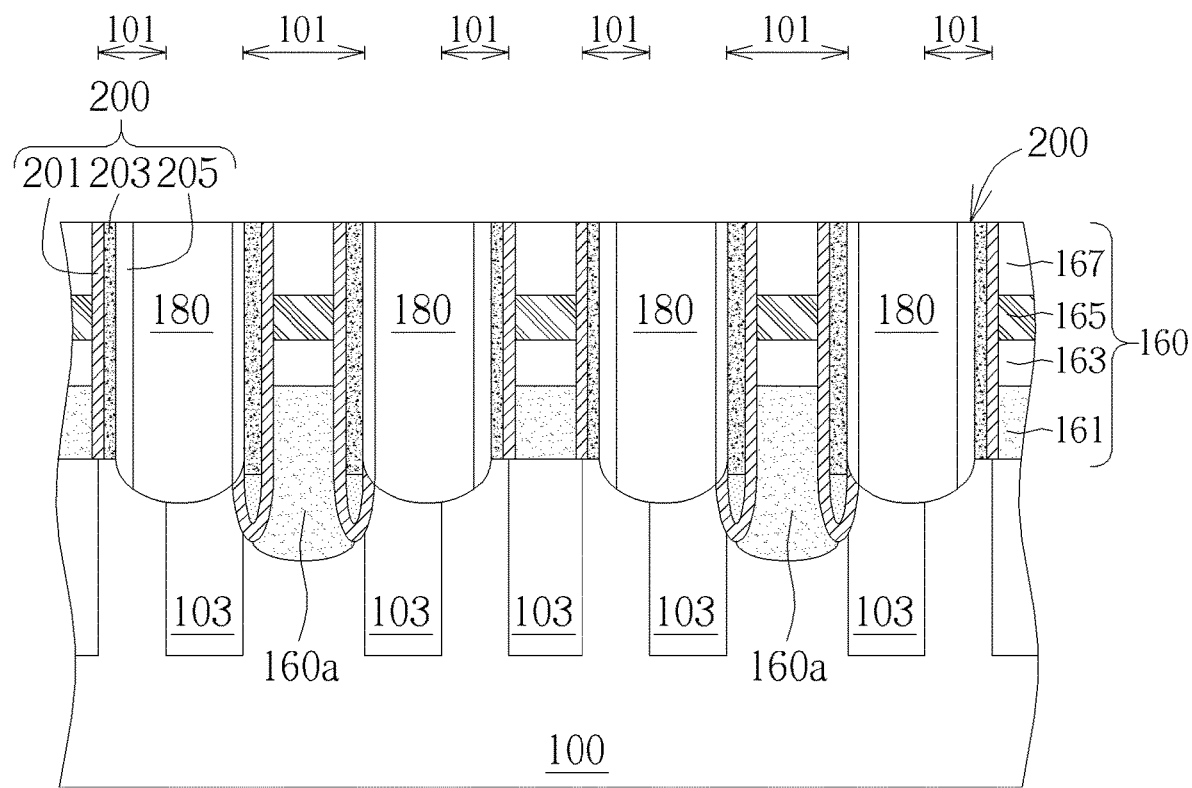

To provide a better understanding of the present invention, preferred embodiments will be described in detail. The preferred embodiments of the present invention are illustrated in the accompanying drawings with numbered elements.

Referring to FIGS. 1-11, FIGS. 1-1 illustrate a forming method of semiconductor memory device according to a first preferred embodiment of the present invention, in which FIGS. 2, 4, 7 and 9 show a top view of a semiconductor memory device during the forming process respectively, others show a cross-sectional view of a semiconductor memory device during the forming process respectively.

In the present embodiment, a method of forming a memory cell such as a dynamic random access memory (DRAM) device, is provided, and the DRAM device at least includes at least one transistor structure (not shown in the drawings) and at least one capacitor structure (not shown in the drawings), thereto serve as the smallest unit in the DRAM array for accepting signals from bit lines 160 and word lines (not shown in the drawings) during the operation.

The DRAM device includes a substrate 100, such as a silicon substrate, a silicon containing substrate like SiC or SiGe, or a silicon on insulator (SOI) substrate, and a plurality of active areas (AAs) 101 and at least one shallow trench isolation (STI) 103 surrounded the AAs 101 are formed in the substrate 100. The AAs 101 are parallel extended along a first direction (not shown in the drawings). Also, a plurality of buried gates (not shown in the drawings) are formed in the substrate 100, which are parallel extended along a second direction D2 which is different from the first direction. The buried gates are namely disposed across the AAs 101, therefore to function like buried word lines (BWLs) of the DRAM device.

Furthermore, a plurality of bit lines 160 is formed on the substrate 100, and which are parallel extended along a third direction D1 which is different from the first direction and the second direction D2, so that, the bit lines 160 are simultaneously across the AAs 101 and the buried word lines. The third direction D1 is for example perpendicular to the second direction D2 and is not perpendicular to the first direction. In one embodiment, each of the bit lines 160 includes a semiconductor layer 161, a barrier layer 163, a metal layer 165 and a mask layer 167, and a portion of the bit lines 160 further includes a bit line contact (BLC) 160a disposed underneath. The bit line contacts 160a and the bit lines are actually monolithic, as shown in FIG. 1.

On the other hand, a plurality of conductive patterns such as the conductive patterns 180 extended along the third direction D1, are also formed on the substrate 100, at two sides of the bit line contacts 160a, and the conductive patterns 180 are predicted to serve as storage nodes (SNs). In one embodiment, each of the conductive patterns 180 includes a silicide layer (not shown in the drawings) directly contacting to the substrate 100 and/or the STI 103, and at least one barrier layer (not shown in the drawings) and at least one metal layer (not shown in the drawings) such as including a low resistant metal material like tungsten (W) disposed on the silicide layer, but is not limited thereto.

The conductive patterns 180 and the bit line contacts 160a are alternately arranged along the second direction D2 (such as a x-direction), and which respectively contacts the substrate 100 disposed at two sides of the buried word lines, so as to electrically connect to a source/drain region of the DRAM device respectively. Also, an isolation structure such as a multilayered spacer 200, is further disposed between each of the conductive patterns 180, and each of the bit lines 160 and the bit line contacts 160a, for isolating the conductive patterns 180, and the bit lines 160 and the bit line contacts 160a. In the present embodiment, each of the spacers 200 for example includes a tri-layered structure including a first layer 201, a second layer 203 and a third layer 205, as shown in FIG. 1. The first layer 201 and the third layer 205 preferably include a material having a great etching selectivity related to that of the second layer 203, such as including silicon nitride (SiN), and the second layer 203 for example includes silicon oxide (SiO), but is not limited thereto.

In one embodiment, the formation of the spacers 200 is but not limited to be accomplished through the following steps. First of all, after forming the bit lines 160, a first material layer, a second material layer and a third material layer are sequentially formed on the substrate 100, covered on the bit lines 160, followed by performing an etching process, to remove the third material layer, the second material layer and the first material layer covered on the top surfaces of the bit lines 160, and to form the spacers 200 including the first layer 201, the second layer 203 and the third layer 205. Then, the conductive patterns 180 are formed, so that, each of the spacers 200 are therefore disposed between the conductive patterns 180 and the bit lines 160, and has a top surface leveled with that of the conductive patterns 180 and the bit lines 160, as shown in FIG. 1.

Figure 2:
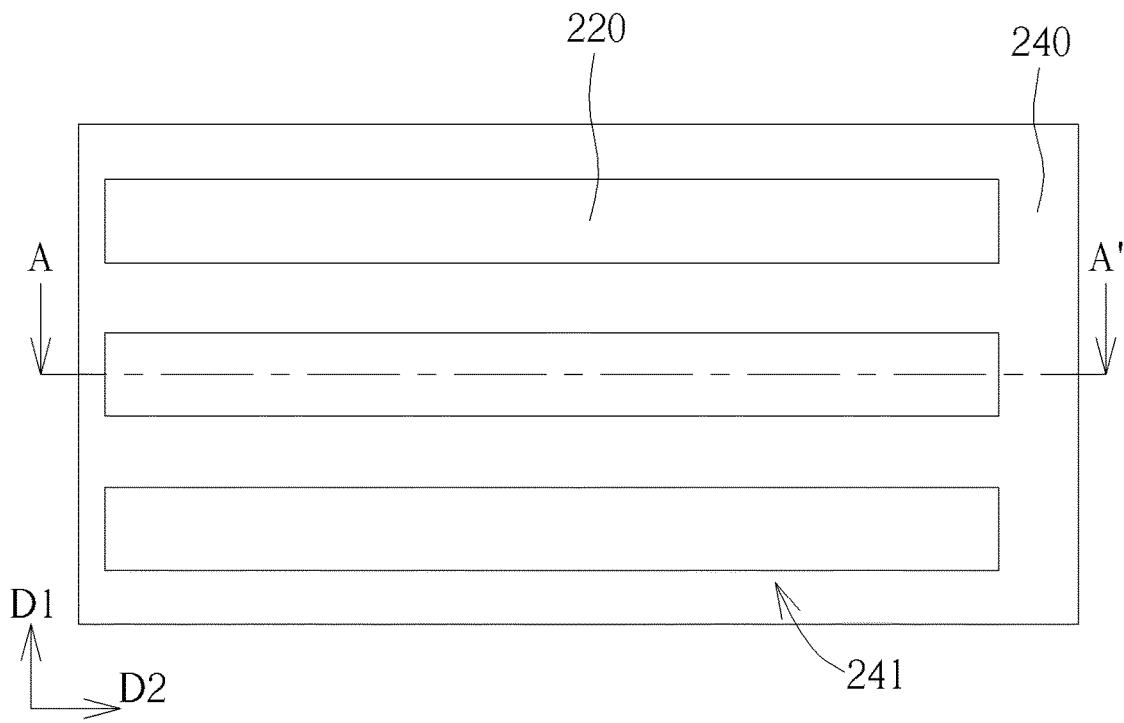
Figure 3:
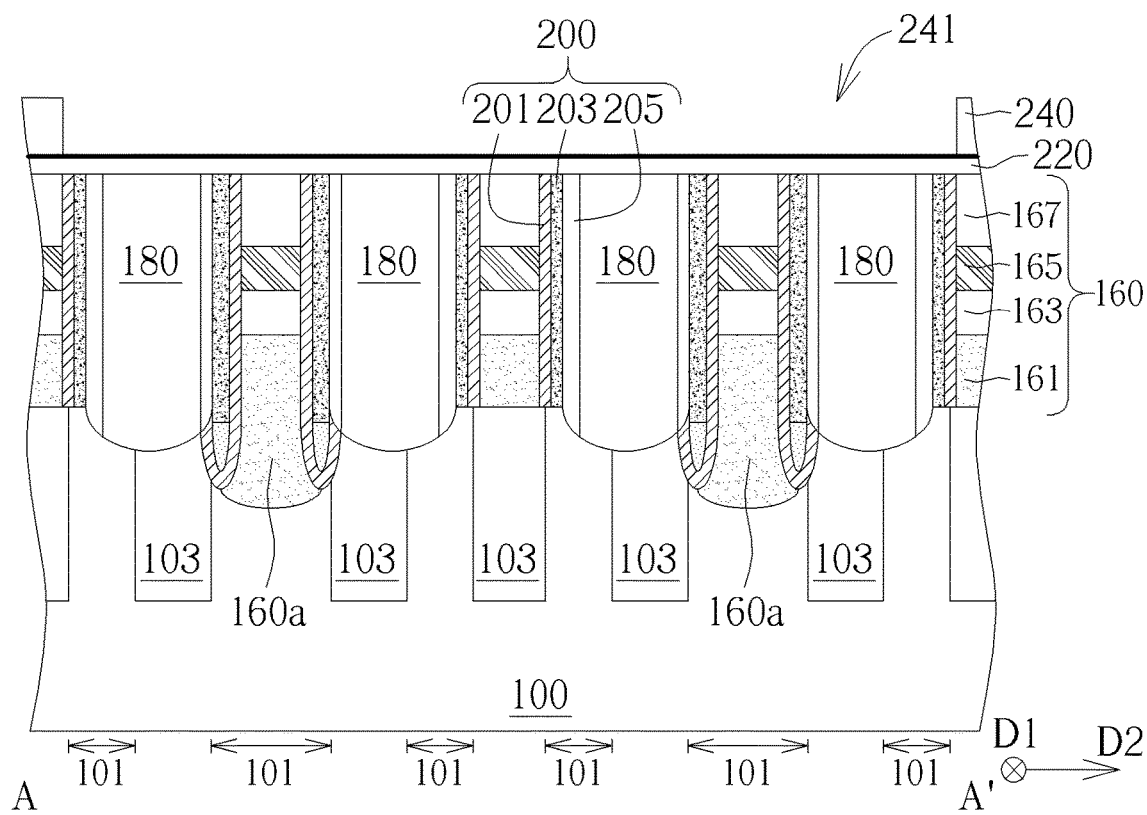

Next, a metal layer 220 and a patterned mask layer 240 are formed on the substrate 100, as shown in FIG. 2. The patterned mask layer 240 covers the metal layer 220, and includes a plurality of openings 241 extended along the second direction D2, for exposing a portion of the metal layer 220 therefrom, as shown in FIG. 3. In one embodiment, the metal layer 220 preferably includes a metal material such as tungsten, but is not limited thereto.

Figure 4:
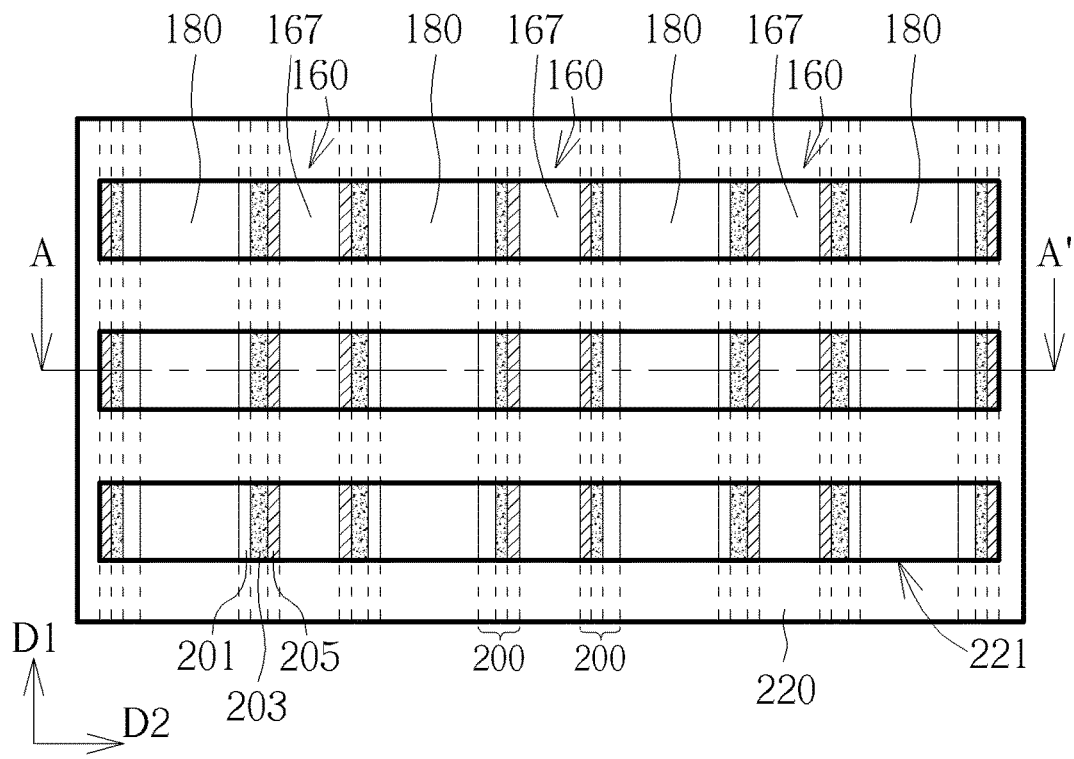
Figure 5:
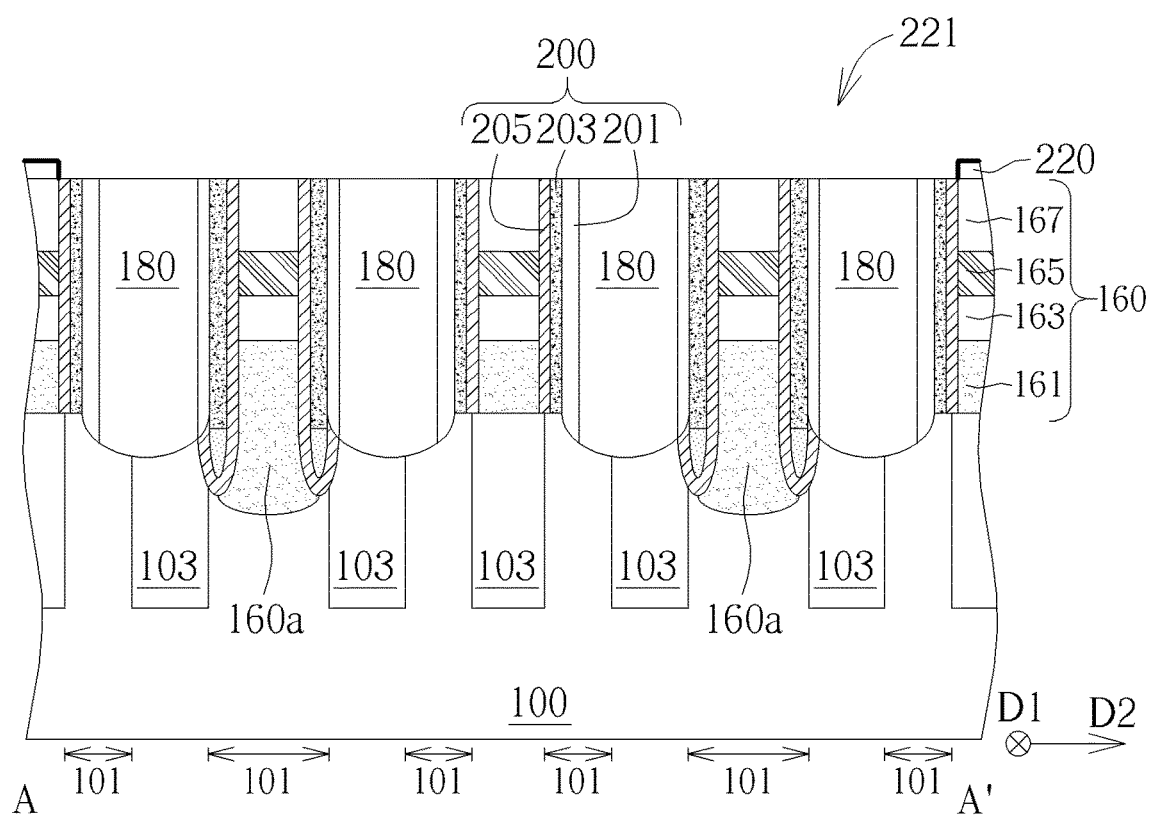

After that, a first etching process such as a wet etching is performed by using the patterned mask layer 240 as a mask, to remove the metal layer 220 which is exposed from the patterned mask layer 240. That is, a plurality of corresponding openings 221 also extended along the second direction D2 is formed in the metal layer 220, as shown in FIG. 4. Through this arrangement, a portion of the conductive patterns 180, a portion of the spacers 200 and a portion of the bit lines 160 are exposed from the openings 221. It is noted that, since the extending direction (namely the second direction D2) of the opening 221 is actually perpendicular to the extending direction of the bit lines 160, the conductive patterns 180 and the spacers 200, each of the bit lines 160, each of the conductive patterns 180, and each of the spacer 200 between each bit line 160 and each conductive pattern 180 are allowable to be partially exposed from each opening 221, as shown in FIG. 5. In other words, after the first etching process, each of the bit lines 160, each of the conductive patterns 180, and each of the spacer 200 therebetween are divided into plural fragments by the metal layer 220.

Figure 6:
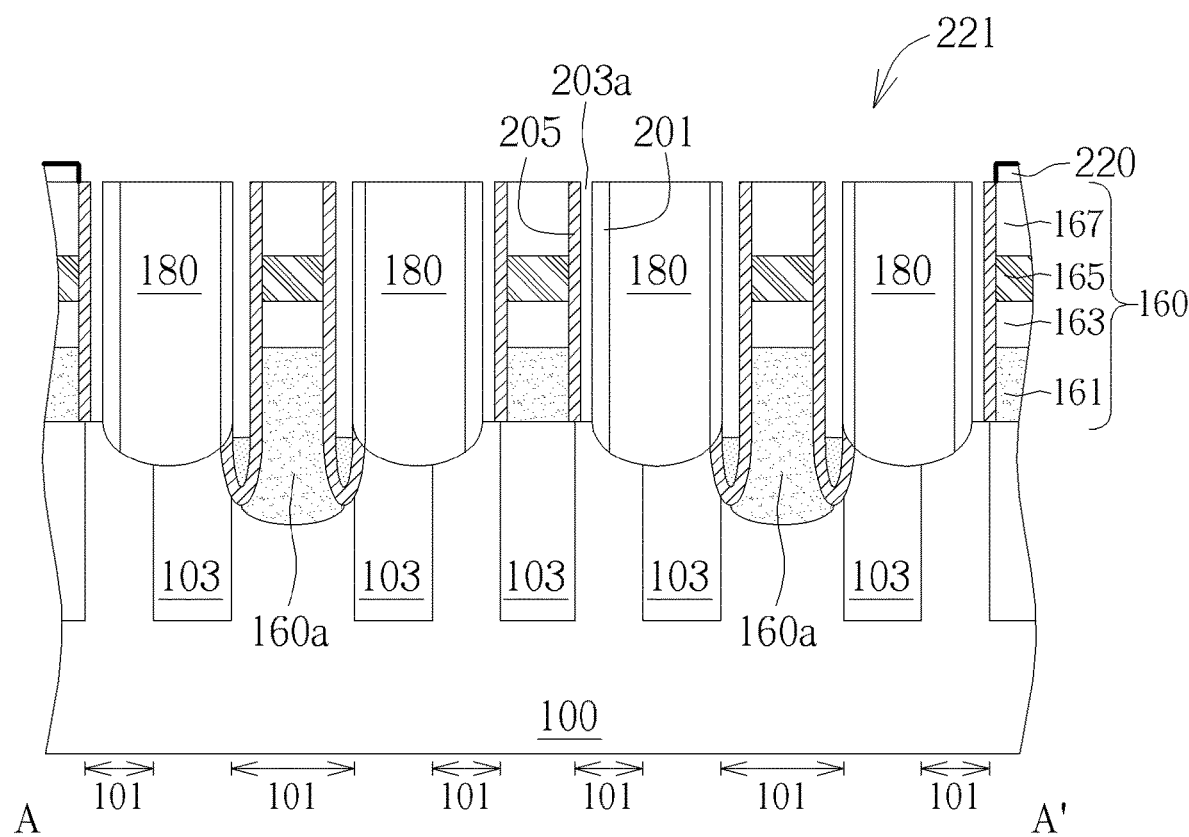

After removing the patterned mask layer 240, another etching process is performed by using the metal layer 220 as a mask, to partially remove the spacers 200. The another etching process is namely performed by using the etching selectivity between the second layer 203 and other two layers 201, 205, so that, only the second layer 203 where is exposed from the openings 221 are removed to form an air-gap layer 203a between the first layer 201 and the third layer 205, as shown in FIG. 6. That is, the air-gap layers 203a are namely formed between conductive patterns 180 and the bit line 160s respectively. It is noteworthy that, the air-gap layers 203a are formed only at the portion that is exposed from the openings 221, so that, the second layers 203 where is covered by the metal layer 220 are not removed during the said another etching process. In other words, the air-gap layer 203a namely includes a plurality of fragments and those fragments are separated from each other along the third direction D1 by the remained second layer 203.

Figure 7:
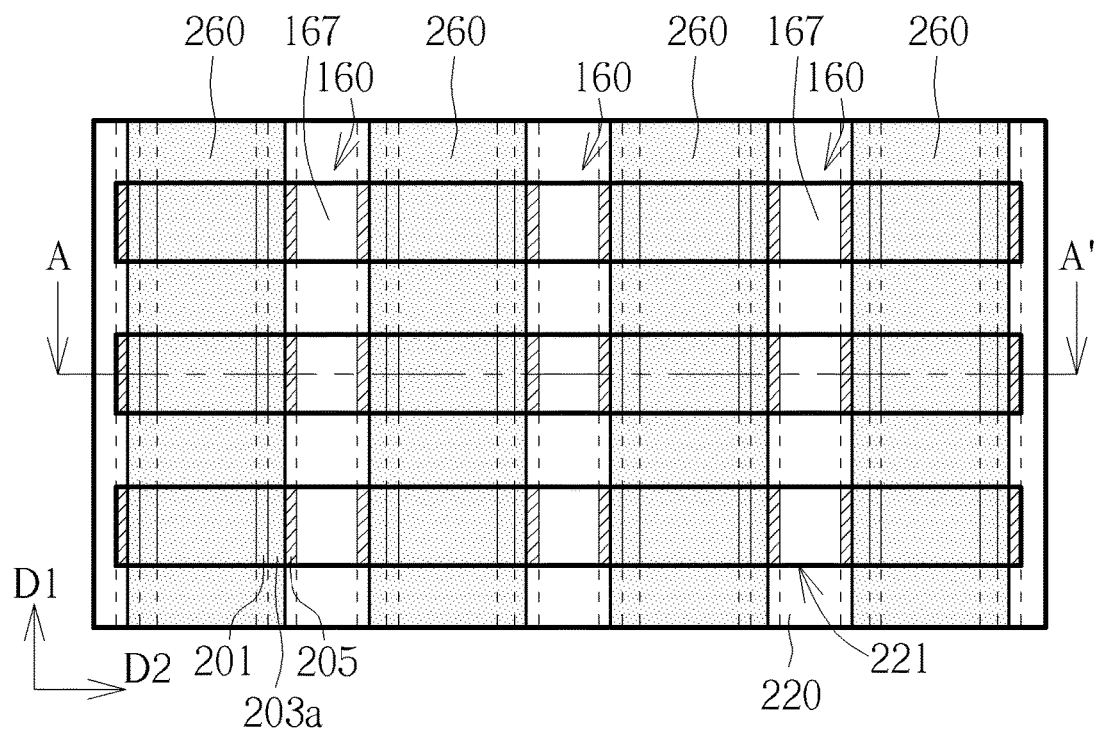
Figure 8:
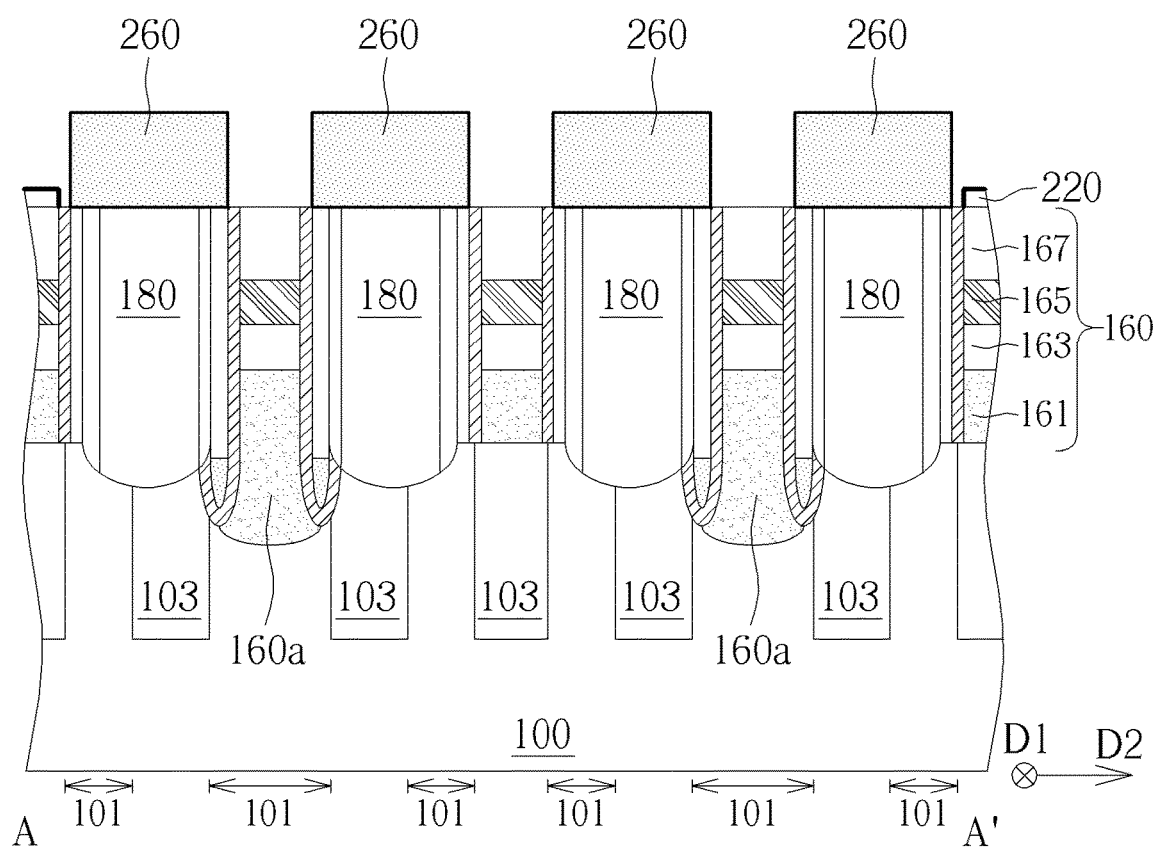

Following these, as shown in FIG. 7, a patterned mask layer 260 is formed on the substrate 100. In the present embodiment, the patterned mask layer 260 includes a plurality of mask patterns extended along the third direction D1, and the mask patterns are preferably in alignment with the spacer 200 and the conductive patterns 180 underneath, to expose the bit lines 160 from the mask patterns respectively, as shown in FIG. 8. While forming the patterned mask layer 260, since the air-gap layer 203a disposed below has a relative smaller diameter, the material of the patterned mask layer 260 may not fill in the air-gap layer 203a. That is, the air-gap layer 203a is sealed by the patterned mask layer 260, to remain the air gap status as shown in FIG. 8.

Figure 9:
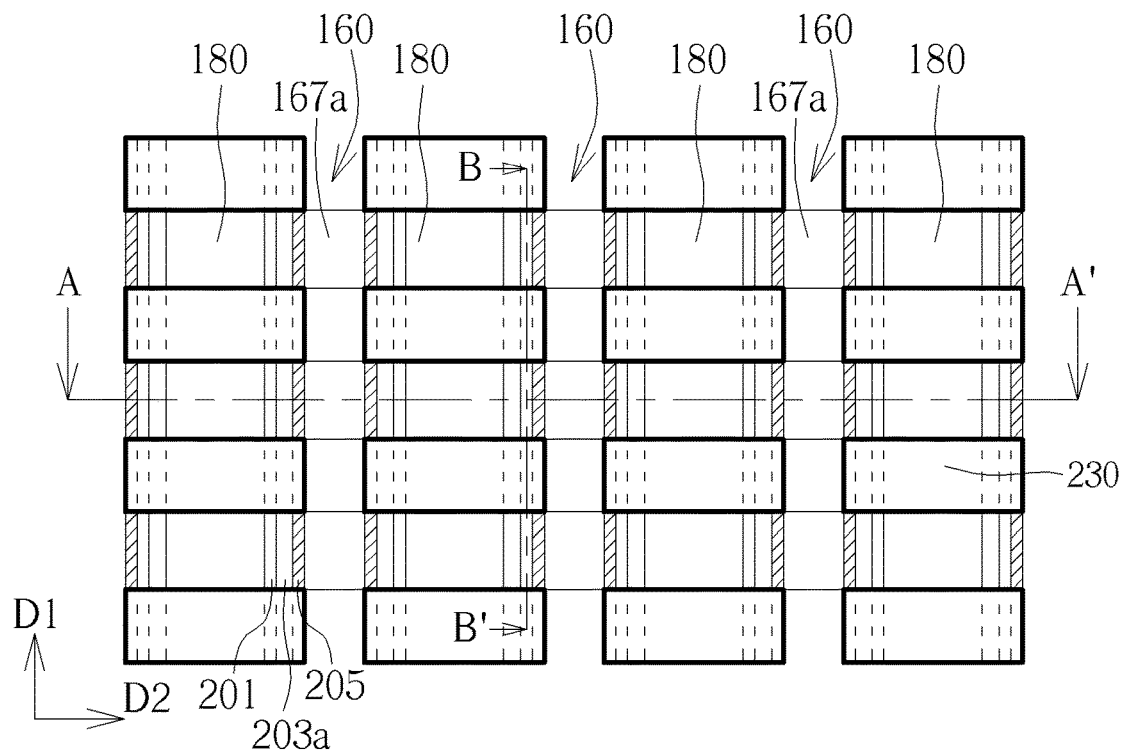

Then, a second etching process such as a wet etching is performed by using the patterned mask layer 260 as a mask, to remove the metal layer 220 which is exposed from the patterned mask layer 260. After the first and the second etching processes, the metal layer 220 may therefore patterned to form a plurality of conductive pads 230 arranged in an array arrangement, corresponding to the conductive patterns 180 underneath. That is, the conductive pads 230 may function like the SN pads of the conductive patterns 180 underneath. Also, it is noted that the conductive pads 230 and each fragment of the air-gap layer 203a are alternately arrangement along the same horizontal surface, as shown in FIG. 9. That is, the spacers 200 where is below the conductive pads 230 still has a tri-layered structure (including the first layer 201, the second layer 203 and the third layer 205), and the spacers 200 where is exposed from the conductive pads 230 includes the air-gap layer 203a.

Figure 10:
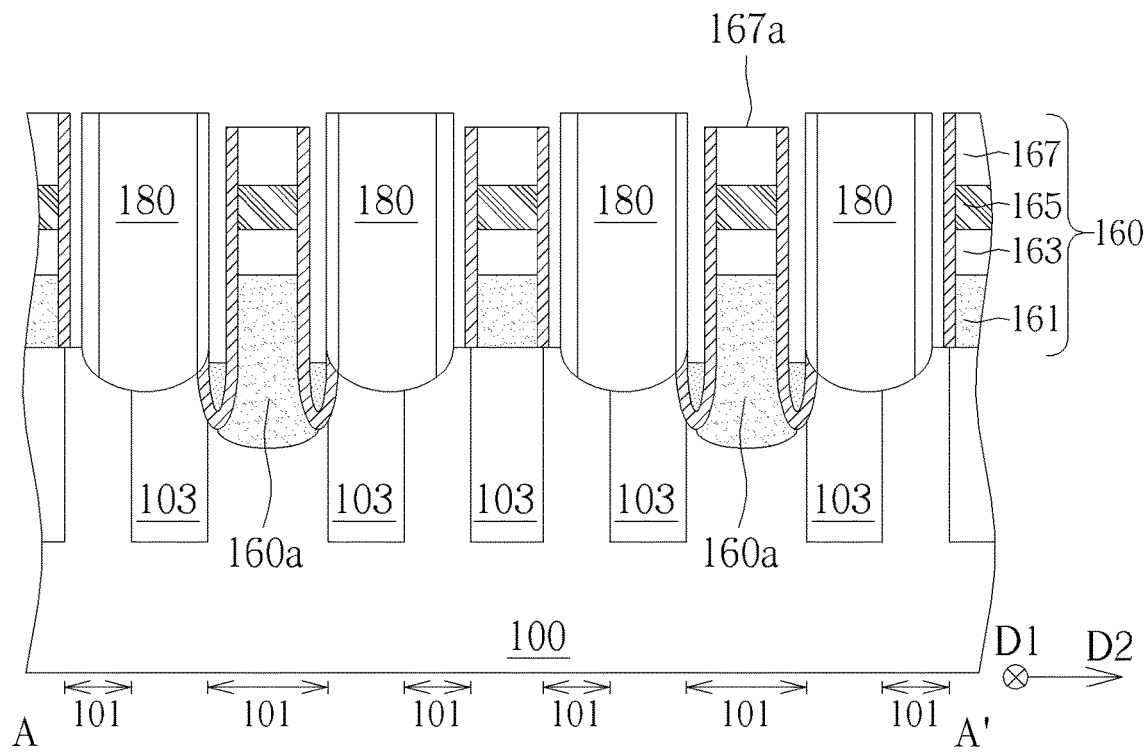
Figure 11:
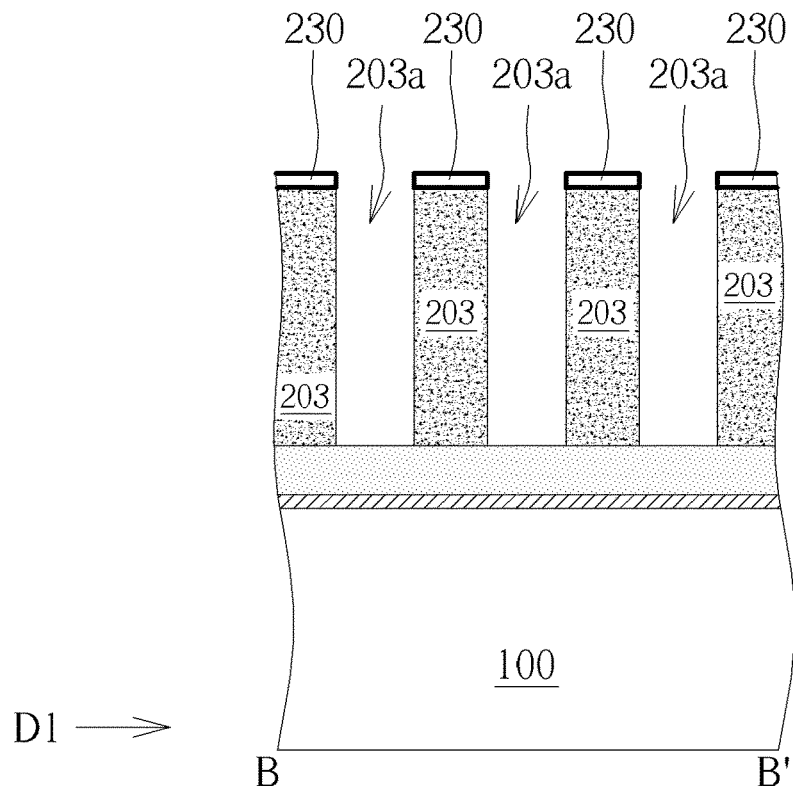

On the other hand, since the mask patterns of the patterned mask layer 260 only covers the spacers 200 and the conductive patterns 180 which are also extended along the third direction D1, and does not cover the bit lines 160, the mask layers 167 of the exposed bit lines 160 are also removed while the removing the metal layer 220 in the second etching process. Through this performance, each of the mask layers 167a may therefore forms a top surface 167a which is lower than the top surfaces of the spacers 200 and the conductive patterns 180, as shown in FIG. 10. Subsequently, after completely removing the patterned mask layer 260, the conductive patterns 180 may be further etched by using the conductive pads 230 as a mask, to remove the conductive patterns 180 where is exposed from the conductive pads 230 and to remain the conductive patterns 180 where is right dispose underneath. In this way, the conductive patterns 180 are further patterned to form a plurality of plugs (not shown in the drawings) which are corresponding to the conductive pads 230 and are directly in contact thereto, so as to function like storage nodes (SN).

According to above, the method of forming semiconductor memory device of the first preferred embodiment is accomplished. In the processes of the present embodiment, after forming the conductive patterns 180, a two-stepped etching process is performed to pattern the metal layer 220 disposed on the conductive patterns 180, to pattern the metal layer 220 into the conductive pads 230 in an array arrangement. Also, between the two etching steps of the two-stepped etching process, the patterned metal layer 220 formed in the first etching step is further used as a mask to partially remove the spacers 200, to form the air-gap layers 203a within each spacer 200s. In other words, under the coverage of the patterned metal layer 220 formed in the first etching step, only the second layer 203 where is exposed therefrom is removed, and the second layer 203 where is under the coverage is remained, as shown FIG. 11. That is, each air-gap layer 203a may therefore include plural separated fragments, with each fragment being separated from each other by the remained parts of the second layer 203 for providing required supporting. Thus, the air-gap layers 203a not only can improve the RC delay issues, but also can provide better supporting than general air gap structure to reduce possible collapse.

People well skilled in the art shall realize the method of forming semiconductor memory device in the present invention is not limited to be achieved through the aforementioned flow, and may also include other forming steps. The following description will detail the different embodiments of the forming method of semiconductor memory device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 12:
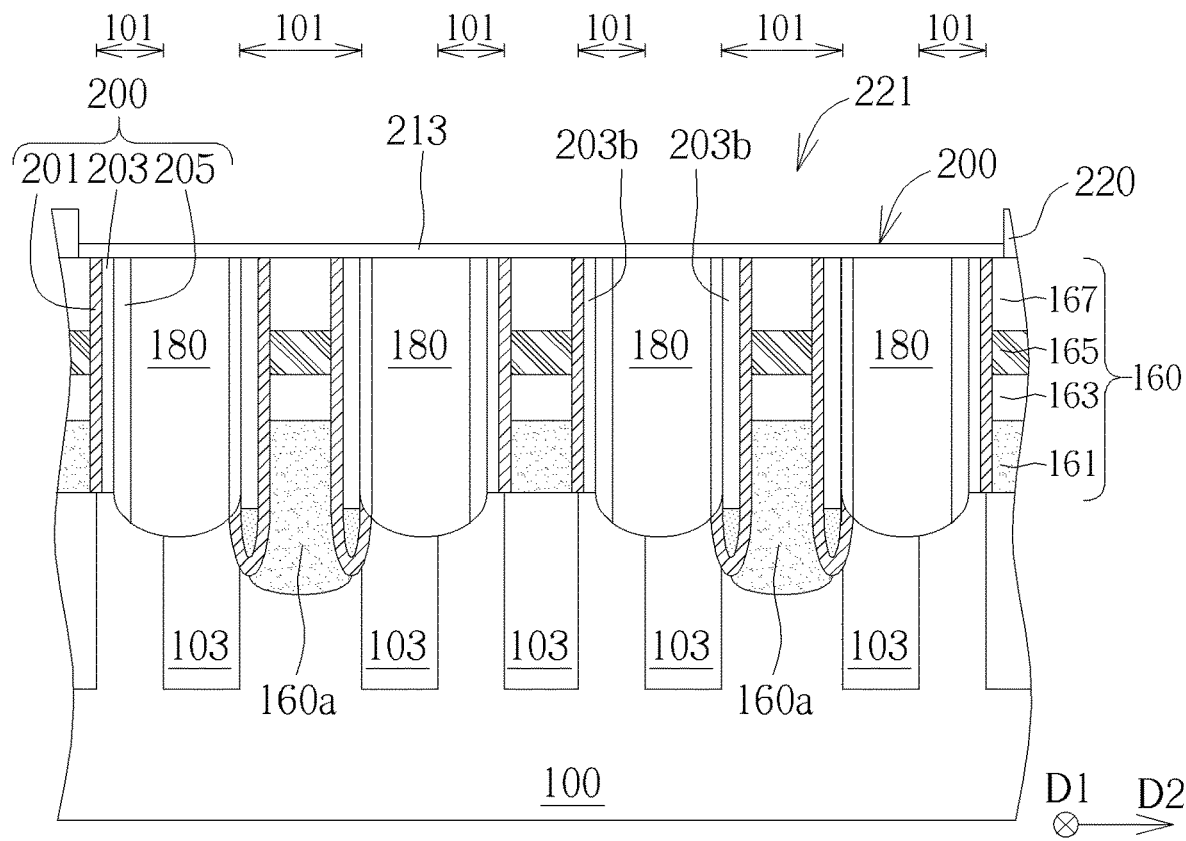
FIG. 12 is a schematic diagram illustrating a method of forming a semiconductor memory device according to a second preferred embodiment of the present invention.

Refers to FIG. 12, which is a schematic diagram illustrating a method of forming semiconductor memory device according to the second preferred embodiment of the present invention. The formal steps in the present embodiment are substantially similar to those in the first preferred embodiment, as shown in FIGS. 1-6, and which will not be redundantly described hereinafter. The differences between the present embodiment and the aforementioned first preferred embodiment are that, after forming the air-gap layers 203a as shown in FIG. 6, a capping layer 213 is additionally formed on the air-gap layers 203a.

Precisely speaking, the capping layer 213 for example includes a material having poor filling capacity such as silicon nitride (SiN), and which covers entirely on the conductive patterns 180, the spacers 200 and the bit lines 160, so as to obtain embedded air-gap layers 203b sealed in the spacer 200 by the capping layer 213, as shown in FIG. 12. Through this performance, the patterned mask layer 260 formed in the subsequent process may directly cover on the capping layer 213, to avoid the patterned mask layer 260 filling in the air-gap layer 203b. After that, the substantially similar processes as shown in FIGS. 7-11 of the first preferred embodiment are performed.

It is noted that, the capping layer 213 additionally formed in the present embodiment is allowable to be partially removed while removing the mask layers 167 of bit lines 160 in the second etching process. Otherwise, the capping layer 213 may also be not removed, to leave the air-gap layers 203b being completely embedded in the spacer 200 by the capping layer 213, as shown in FIG. 12.

According to above, the method of forming semiconductor memory device of the second preferred embodiment is accomplished. In the processes of the present embodiment, the air-gap layers 203b are also formed between the two etching steps, by using the patterned metal layer 220 formed in the first etching step as a mask, to make each of the air-gap layers 203b to have plural separated fragments. Also, in the present embodiment, the capping layer 213 is further formed on the air-gap layers 203b, followed by performing the second etching step, so as to avoid the air-gap layer 203b being affect by the second etching step. That is, the air-gap layer 203b of the present embodiment is allowable to improve the RC delay issues under a more simplified process, and also, to further improve the aforementioned possible collapse.

In overall speaking, the forming method of the present invention is mainly performed by forming an air-gap layer between the bit lines and the storage nodes during the forming processes of the storage nodes, with the second layer of the multilayered spacer being partially etched under the coverage of the patterned metal layer formed in the previously first etching step. That is, only a part of the second layer of the multilayered spacer is removed to form the air-gap layer, and the rest part of the second layer of the multilayered spacer is remained, so as to make the air-gap layer to include plural separate fragments. The separate fragments of the air-gap layer are namely separated by the remained second layer, so that, the air-gap layer of the present invention may both achieve the lower dielectric constant and better supporting. Thus, the method of the present invention can improve the RC delay issue and the possible collapse at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a plurality of bit lines, extended along a first direction;
   a plurality of conductive patterns, extended along the first direction, the bit lines and the conductive patterns being alternately arranged along a second direction which is perpendicular to the first direction;
   a plurality of conductive pads, disposed in an array arrangement, on the conductive patterns and the bit lines; and
   a tri-layered spacer, disposed between the bit lines and the conductive patterns in the second direction, below the conductive pads, wherein the tri-layered spacer extends along the first direction and comprises a first layer, a second layer and a third layer, and the second layer comprises a plurality of air-gap layers separately disposed therein along the first direction, and the second layer comprises silicon oxide disposed alternately with the air gap layers in the first direction.

2. The semiconductor memory device according to claim 1, further comprising:
   a capping layer disposed on the air-gap layers.

3. The semiconductor memory device according to claim 2, wherein the capping layer comprises a material the same as that of the first layer and the third layer.

4. The semiconductor memory device according to claim 1, wherein the air-gap layers and the conductive pads are alternately arranged along a same horizontal surface.

5. A semiconductor memory device, comprising:
   a plurality of bit lines, extended along a first direction;
   a plurality of conductive patterns, extended along the first direction, the bit lines and the conductive patterns being alternately arranged along a second direction which is perpendicular to the first direction;
   a plurality of conductive pads, disposed in an array arrangement, on the conductive patterns and the bit lines; and
   a tri-layered spacer, disposed between the bit lines and the conductive patterns in the second direction, below the conductive pads, wherein the tri-layered spacer extends along the first direction and comprises a first layer, a second layer and a third layer, and the second layer comprises a plurality of fragments and a plurality of air-gap layers, wherein the air gap layers and the fragments are alternately arranged along the first direction.

6. The semiconductor memory device according to claim 5, further comprising:
   a capping layer disposed on the air-gap layers.

7. The semiconductor memory device according to claim 6, wherein the capping layer comprises a material the same as that of the first layer and the third layer.

8. The semiconductor memory device according to claim 5, wherein the air-gap layers and the conductive pads are alternately arranged along a same horizontal surface.

9. The semiconductor memory device according to claim 5, wherein the fragments comprise silicon oxide.

* * * * *